(12) United States Patent
Porshnev et al.

(10) Patent No.: US 8,900,405 B2
(45) Date of Patent: Dec. 2, 2014

(54) PLASMA IMMERSION ION IMPLANTATION REACTOR WITH EXTENDED CATHODE PROCESS RING

(75) Inventors: Peter I. Porshnev, San Jose, CA (US);
Majeed A. Foad, Sunnyvale, CA (US);
Kartik Ramaswamy, San Jose, CA (US); Biagio Gallo, Palo Alto, CA (US);
Hiroji Hanawa, Sunnyvale, CA (US);
Andrew Nguyen, San Jose, CA (US);
Kenneth S. Collins, San Jose, CA (US);
Amir Al-Bayati, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1530 days.

(21) Appl. No.: 11/985,579

(22) Filed: Nov. 14, 2007

(65) Prior Publication Data
US 2009/0120367 A1    May 14, 2009

(51) Int. Cl.
C23C 16/00 (2006.01)
H01L 21/306 (2006.01)
H01J 37/32 (2006.01)

(52) U.S. Cl.
CPC ..... *H01J 37/32642* (2013.01); *H01J 37/32412* (2013.01)
USPC .................................. 156/345.48; 118/723 I

(58) Field of Classification Search
CPC ...................... H01J 37/32642; H01J 37/32651;
H01J 37/20; H01J 37/32715; H01J 37/724;
H01J 37/32733; H01J 37/32743; H01J
37/32752; H01J 37/32761; H01J 37/3277;
H01J 37/32779; H01J 37/32788; H01L
21/683; H01L 21/6831; H01L 21/6833;
C23C 14/50
USPC ....... 118/723 I, 723 IR, 723 AN; 156/345.48,
156/345.49; 315/111.51
See application file for complete search history.

(56) References Cited

U.S. PATENT DOCUMENTS

| | | | |
|---|---|---|---|
| 6,039,836 A * | 3/2000 | Dhindsa et al. | 156/345.1 |
| 6,123,791 A * | 9/2000 | Han et al. | 156/1 |
| 6,494,986 B1 * | 12/2002 | Hanawa et al. | 156/345.35 |
| 6,554,954 B2 * | 4/2003 | Ma et al. | 156/345.51 |
| 7,094,670 B2 | 8/2006 | Collins et al. | 438/513 |
| 2005/0087305 A1 * | 4/2005 | Nishio et al. | 156/345.51 |
| 2005/0234446 A1 | 10/2005 | Van Wyk et al. | 608/41 |
| 2007/0032095 A1 | 2/2007 | Ramaswamy et al. | 438/795 |
| 2007/0169891 A1 | 7/2007 | Koshiishi et al. | 156/345.47 |

* cited by examiner

*Primary Examiner* — Luz Alejandro Mulero
(74) *Attorney, Agent, or Firm* — Robert M. Wallace

(57) ABSTRACT

The disclosure concerns a process ring for the wafer support pedestal of a toroidal source plasma immersion ion implantation reactor. The process ring improves edge uniformity by providing a continuous surface extending beyond the wafer edge, in one embodiment. In another embodiment, the process ring includes a floating electrode that functions as an extension of the wafer support electrode by RF coupling at the bias frequency.

18 Claims, 6 Drawing Sheets

PLASMA IMMERSION ION IMPLANTATION REACTOR WITH EXTENDED CATHODE PROCESS RING

TECHNICAL FIELD

The disclosure concerns a process ring for the wafer support pedestal of a toroidal source plasma immersion ion implantation reactor for implanting a semiconductor wafer or workpiece. In particular the process ring improves edge uniformity.

BACKGROUND

Plasma immersion ion implantation is employed to form source and drain junctions in a semiconductor material. Low energy and high dose implants are now sought after using a toroidal plasma source. A plasma is generated from a process gas containing a chemical species including the species desired to be ion implanted in the wafer. A problem encountered in a particular type of toroidal source plasma immersion ion implantation reactor has been a non-uniform radial distribution of dopant concentration across the wafer, manifested as a spike in dopant concentration at the outer peripheral edge of the wafer. A related problem has been a non-uniform radial distribution of etch rate of the silicon gate electrode(s) across the wafer, manifested as a spike in gate electrode etch rate at the outer peripheral edge of the wafer. These problems are due to at least one if not all of the following factors: (a) bending at the wafer edge of the RF electrical field in the plasma sheath and bending of the plasma sheath itself at the wafer edge, leading to greater concentration of plasma ions over the wafer edge; (b) a spike in the wafer temperature at the wafer edge due to the concentration of plasma ions over the wafer edge; and (c) discontinuity in gas flow at the wafer edge, leading to a spike in gas residency time at the wafer edge and greater dissociation to form more volatile etchant species over the wafer edge.

There is a need to solve these problems in a toroidal source plasma ion immersion reactor.

SUMMARY

A plasma ion immersion plasma reactor is provided for ion implanting selected species into a wafer. The reactor includes a reactor chamber with a ceiling gas distribution plate and a wafer support pedestal with a wafer support surface and an insulated electrode underlying said wafer support surface, said wafer support surface and said ceiling gas distribution plate defining a process zone between them. A pair of toroidal plasma paths intersecting in the process zone are established by a pair of mutually transverse reentrant conduits external of said chamber, each of said conduits being coupled to said chamber at ports on opposing sides of said process zone, and respective RF plasma source power applicators for coupling RF power into the interiors of respective ones of said reentrant conduits. A dielectric ring surrounds said wafer support surface. The ring includes a first annular ring surface that is co-planar with or above said wafer support surface, said ring surface having an inner diameter that is separated from a circumferential periphery of said wafer support surface by a gap not exceeding about 1% of the diameter of said wafer support surface. In one embodiment, the ring further includes a second annular ring surface surrounding said first annular ring surface, said second annular ring surface being displaced above said first annular ring surface by a height at least as great as a thickness of a wafer to be held on said wafer support surface. In another embodiment, the ring extends beyond the periphery of the wafer support surface by 10-20% of the wafer support diameter.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The drawings in the figures are all schematic and not to scale.

DETAILED DESCRIPTION

Figure 1:
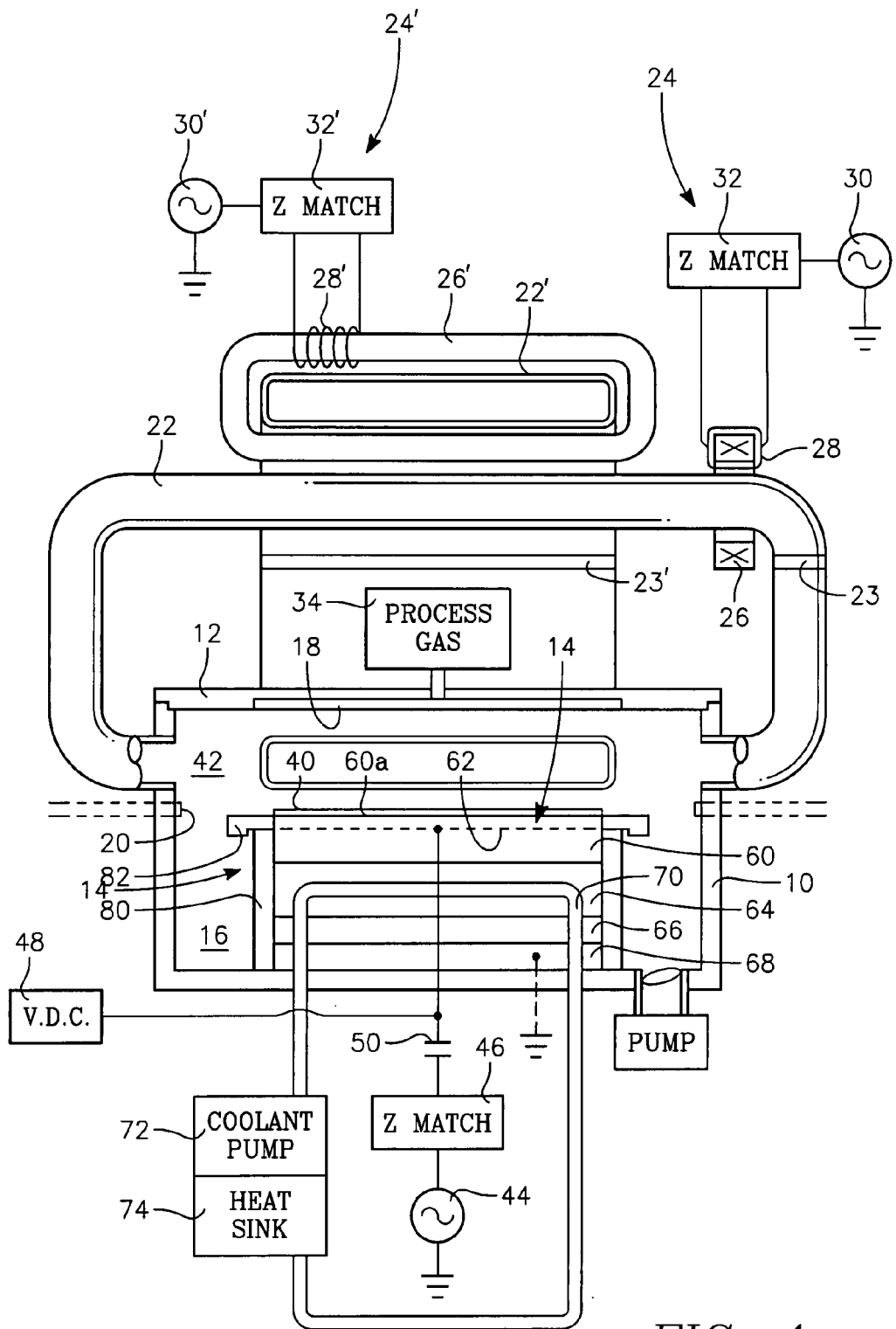
FIG. 1 illustrates a plasma immersion ion implantation reactor including a process ring in accordance with one embodiment.

FIG. 1 depicts a toroidal source plasma reactor for performing plasma immersion ion implantation. The plasma reactor has a cylindrical side wall 10, a ceiling 12 and a wafer contact-cooling electrostatic chuck 14. A pumping annulus 16 is defined between the chuck 14 and. the sidewall 10. Process gases are introduced through a gas distribution plate 18 (or "showerhead") forming a large portion of the ceiling 12. Optionally, process gases may also be introduced through side injection nozzles 20 or by other means. The reactor of FIG. 1 has a reentrant RF toroidal plasma source consisting of an external reentrant tube 22 coupled to the interior of the reactor through opposite sides of the sidewall 10 (or, through openings in the ceiling 12 not shown in FIG. 1). An insulating ring 23 provides a D.C. break along the reentrant tube 22. The toroidal plasma source further includes an RF power applicator 24 that may include a magnetically permeable toroidal core 26 surrounding an annular portion of the reentrant tube 22, a conductive coil 28 wound around a portion of the core 26 and an RF plasma source power generator 30 coupled to the conductive coil through an optional impedance match circuit 32. A second external reentrant tube 22' transverse to the first tube 22 is coupled to the interior of the reactor through opposite sides of the sidewall 10 (or, through openings in the ceiling 12 not shown in FIG. 1). An insulating ring 23' provides a D.C. break along the second reentrant tube 22'. A second RF power applicator 24' includes a magnetically permeable toroidal core 26' surrounding an annular portion of the reentrant tube 22', a conductive coil 28' wound around a portion of the core 26' and an RF plasma source power generator 30' coupled to the conductive coil through an optional impedance match circuit 32'. A process gas supply 34 is coupled to the gas distribution plate 18 (or to the gas injectors 20). A semiconductor wafer or workpiece 40 is placed on top of the chuck 14. A processing region 42 is defined between the wafer 40 and the ceiling 12 (including the gas distribution plate 18). A toroidal plasma current oscillates at the frequency of the RF plasma source power generator 30 along a closed toroidal path extending through the reentrant tube 22 and the processing region 42.

RF bias power or voltage is applied to the chuck 14 by an RF bias power generator 44 through an impedance match circuit 46. A D.C. chucking voltage is applied to the chuck 14 from a chucking voltage source 48 isolated from the RF bias power generator 44 by an isolation capacitor 50. The RF power delivered to the wafer 40 from the RF bias power generator 44 can heat the wafer 40 to temperatures beyond 400 degrees C., depending upon the level and duration of the applied RF plasma bias power from the generator 44 if no wafer cooling is employed. It is believed that about 80% or more of the RF power from the bias power generator 44 is dissipated as heat in the wafer 40. The wafer support pedestal 14 is an electrostatic chuck having an insulative or semi-insulative top layer or puck 60. A metal (molybdenum, for example) wire mesh or metal layer 62 inside of the puck 60 forms a cathode (or electrode) to which the D.C. chucking voltage and RF bias voltage is applied. The puck 60 is supported on a metal layer 64 that rests on a highly insulative layer 66. A metal base layer 68 may be connected to ground. The wafer 40 is electrostatically held on the chuck 14 by applying a D.C. voltage from the chucking voltage source 48 to the electrode 62. This induces an opposite (attractive) image charge in the bottom surface of the wafer 40. The effective gap between the two opposing charge layers is so minimal as a result of the upward charge migration in the semi-insulator layer 60 that the attractive force between the chuck and the wafer 40 is very large for a relatively small applied chucking voltage. The puck semi-insulator layer 60 therefore is formed of a material having a desired charge mobility, so that the material is not a perfect insulator. RF bias power or voltage from the RF bias power generator 44 may be applied to the electrode 62 or, alternatively, to the metal layer 64 for RF coupling through the semi-insulative puck layer 60. Heat is removed from the puck 60 by cooling the metal layer 64. For this reason, internal coolant passages 70 are provided within the metal layer 64 coupled to a coolant pump 72 and heat sink or cooling source 74. Heat sink 74 may optionally be a heat exchanger which can also furnish heat, if desired, to metal layer 64. A very high heat transfer coefficient between the wafer 40 and the puck 60 is realized by maintaining a very high chucking force. The force can be enhanced by providing a polished surface 60a.

The plasma reactor of FIG. 1 may be used to perform plasma immersion ion implantation of dopant impurities into a semiconductor layer or wafer to form of source and drain semiconductor junctions in a semiconductor wafer or layer. In order to achieve the ion implantation depth profile required for such junctions, the RF bias generator 44 may produce a very high RF voltage (e.g., 5-15 kV), which determines the junction depth. In order to accommodate such high RF bias voltage without arcing or breakdown, the electrostatic chuck 14 may be a high voltage electrostatic chuck or wafer support pedestal of the type described with reference to FIGS. 97 and 98 of U.S. Patent Application Publication US 2004/0200417 A1, the entire disclosure of which is incorporated herein by reference.

Plasma immersion ion implantation is employed to form source and drain junctions in the wafer 40 (if the wafer is a semiconductor material) or in a semiconductor layer provided on the wafer 40. Typically, the source and drain extensions of a field effect transistor are formed by ion implanting dopant impurities after a transistor gate electrode has been formed and defined over a source-drain channel region. The gate electrode is typically formed of silicon (e.g., polycrystalline silicon). Typically, dopant impurities are implanted into the gate electrode to provide the requisite electrical conductivity in the gate electrode. This may be done during source-drain ion implantation or in a separate step if desired. During ion implantation, some of the material of the gate electrode is removed or etched away, due to ion bombardment and/or the presence of etchant species (e.g., fluorides) in the plasma process gas. (Some plasma process gases may consists of a chemical combination of the desired dopant species with fluorine, such boron tri-fluoride in the case of a boron implant.)

The toroidal plasma source of the plasma immersion ion implantation reactor of FIG. 1 is particularly advantageous because, unlike other types of plasma sources, the toroidal source contributes a negligible amount of ion energy to the plasma while producing any desired plasma ion density, from a very low density to a very high density, as great at $10^{11}$ ions/cc. This provides a very wide range of implant dosage rates. In this way, regardless of ion density, or equivalently the implant dosage rate, the implant depth profile is controlled almost exclusively by output power level of the RF bias power generator 44. The RF bias power can be set to any desired value (e.g., a high level for deep junction implants and a low level for shallow junction implants) without significantly affecting plasma ion generation in the reactor of FIG. 1. This allows the reactor to realize any desired implant dosage rate with any desired implant depth profile.

A problem encountered in the toroidal source plasma immersion ion implantation reactor of FIG. 1 when processing particularly large wafers (e.g., wafers having a diameter of 300 mm or greater) has been a non-uniform radial distribution of dopant concentration across the wafer, manifested as a spike in dopant concentration at the outer peripheral edge of the wafer. A related problem has been a non-uniform radial distribution of etch rate of the silicon gate electrode(s) across the wafer, manifested as a spike in gate electrode etch rate at the outer peripheral edge of the wafer. These problems are due to at least one if not all of the following factors: (a) bending at the wafer edge of the RF electrical field in the plasma sheath (driven by the RF bias generator 44) and bending of the plasma sheath itself at the wafer edge, leading to greater concentration of plasma ions over the wafer edge; (b) a spike in the wafer temperature at the wafer edge due to the concentration of plasma ions over the wafer edge; and (c) discontinuity in gas flow at the wafer edge, leading to a spike in gas residency time at the wafer edge and greater dissociation to form more volatile etchant species over the wafer edge.

In embodiments described herein, non-uniformity (e.g., a spike) in dopant concentration and/or etch rate at the outer peripheral edge of the wafer 40 is eliminated or reduced. A special process ring 82 is supported on a cylindrical wall 80 of the pedestal 14. Embodiments of the process ring 82 described herein solve or reduce the problems at the wafer edge noted above of sheath/electric field bending, wafer temperature spike and gas flow discontinuity. The process ring 82 may be formed of a process-compatible material, including a ceramic material such as alumina in the case of plasma processing of silicon-containing thin films. The cylindrical wall 80 of the pedestal 14 may be formed of a ceramic such as alumina as well. Alternatively, the cylindrical wall may comprise a ceramic outer surface and a metallic internal layer (not shown). An alternative material for the process ring 82 may be quartz, provided process gases are employed that do not attack quartz.

Referring to FIG. 1, the process ring 82 in accordance with a first embodiment extends significantly beyond the cylindrical wall 80 of the pedestal 14, by a distance of about twice the annular thickness of the cylindrical wall 80. The annular thickness of the cylindrical wall 80 is approximately 5%-10% of the diameter of the wafer 40, so that the process ring 82 extends beyond the pedestal 14 (or beyond the peripheral edge of the wafer 40) by approximately 10%-20% of the wafer diameter. The process ring 82 of this first embodiment has a top surface that is co-planar with the wafer-support surface 60a of the puck 60. This extension of the process ring 82 beyond the cylindrical wall 80 essentially pushes the undesired effects (plasma sheath bending, temperature spike and gas flow discontinuity) so far beyond the outer peripheral edge of the wafer 40 that they have no effect over the wafer.

Figure 2:
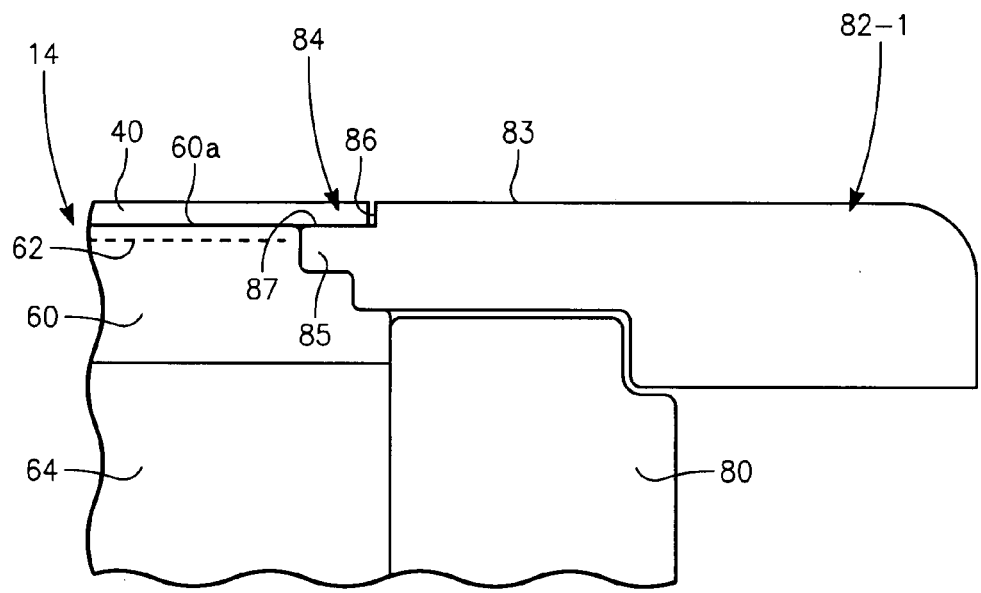
FIG. 2 depicts a first embodiment of a process ring for the reactor of FIG. 1.

FIG. 2 depicts a process ring 82-1 that is identical to the process ring 82 of FIG. 1 except that the top surface 83 of the process ring 82-1 is raised above the plane of the wafer support surface 60a to be co-planar with the plane of the top surface of the wafer 40. In the embodiment of FIG. 2, the diameter of the puck 60 is less than that of the wafer 40 so that a peripheral annular portion of the wafer 40 extends beyond the diameter of the puck 60. A shelf 84 is provided in the process ring 82-1 including a porch 85 and a shelf edge 86. The porch 85 extends beneath the overhanging outer portion of the wafer 40 and provides a peripheral wafer support surface 87 co-planar with the puck wafer support surface 60a. The shelf edge 86 faces the edge of the wafer 40 and is a transition between the two horizontal surfaces 83, 87 of the process ring 82-1. There may be a small gap between the edge of the wafer 40 and the shelf edge 86. In another embodiment, the top surface 83 of the process ring 82-1 of FIG. 2 may be parallel to but slightly above the top surface of the wafer 40.

Figure 3:
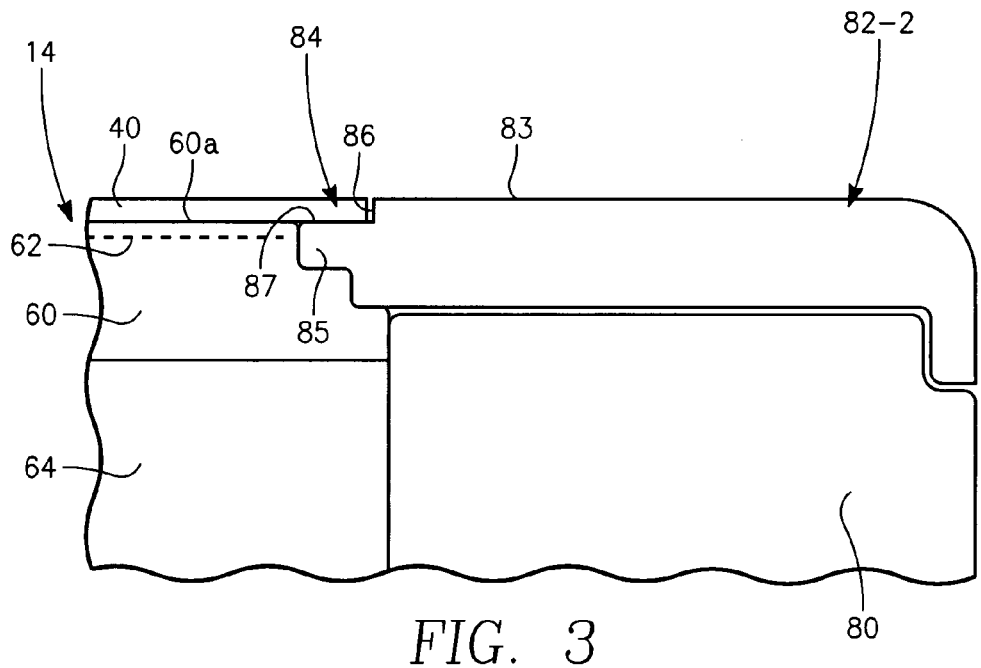
FIG. 3 depicts a second embodiment of a process ring for the reactor of FIG. 1.

FIG. 3 depicts a process ring 82-2 similar to that of FIG. 2 but does not extend beyond the diameter of the pedestal cylindrical side wall 80. In the embodiment of FIG. 3, the top surface 83 of the process ring 82-3 is either co-planar with the top surface of the wafer 40 or may be slightly above it.

Figure 4:
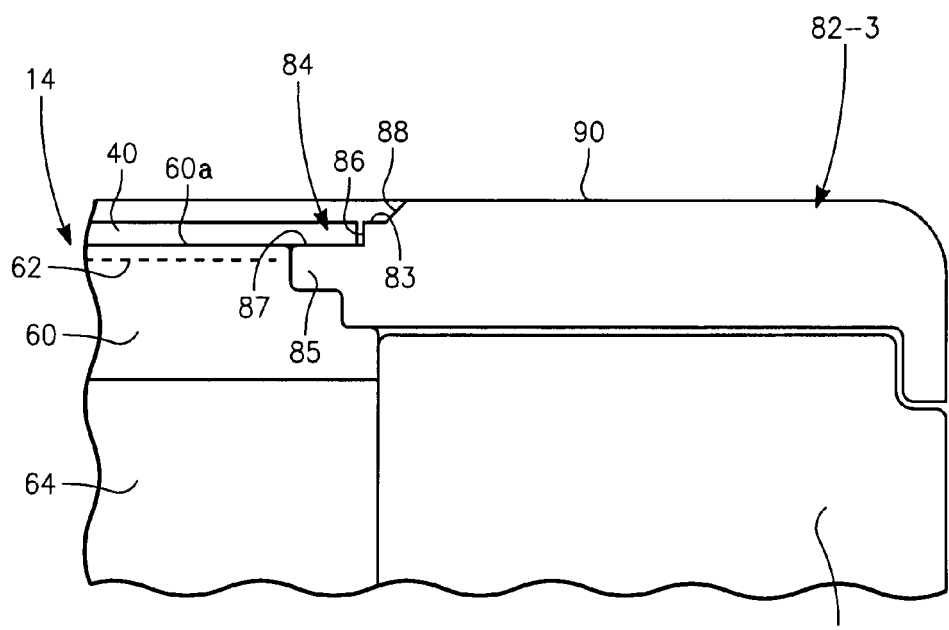
FIG. 4 depicts a third embodiment of a process ring for the reactor of FIG. 1.

FIG. 4 depicts a process ring 82-3 similar to that of FIG. 3, except that it includes, in addition, an outer top surface 90 that is elevated above the surface 83, and a transition surface 88 between the elevated outer top surface 90 and the surface 83. In the embodiment of FIG. 4, the outer top surface 90 is elevated above the top surface of the wafer 40 by about the thickness (e.g., 1-2 mm) of the wafer 40. Equivalently, the top surface 90 is elevated above the outer wafer support surface 87 by about twice the thickness (2-4 mm) of the wafer 40. The surface 83 is therefore at an intermediate height between the wafer support surface 87 and the elevated outer top surface 90. The intermediate surface 83 has an annular extent in the horizontal plane on the order of 1-2 mm.

Figure 5:
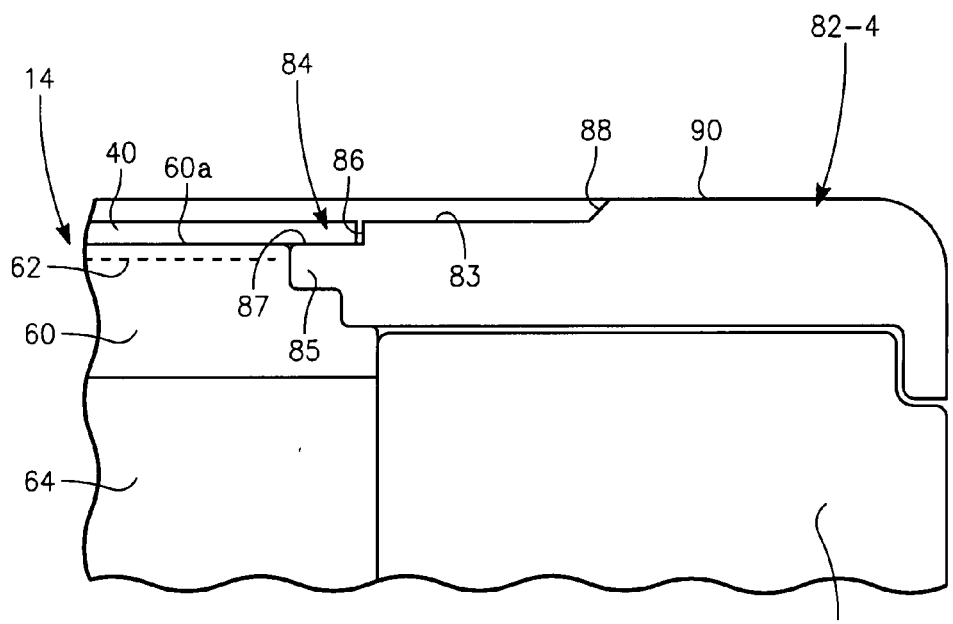
FIG. 5 depicts a fourth embodiment of a process ring for the reactor of FIG. 1.

FIG. 5 depicts a process ring 82-4 identical to that of FIG. 4 except that the intermediate surface 83 has an annular extent that is significantly greater, for example on the order of 10-15 mm.

Figure 6:
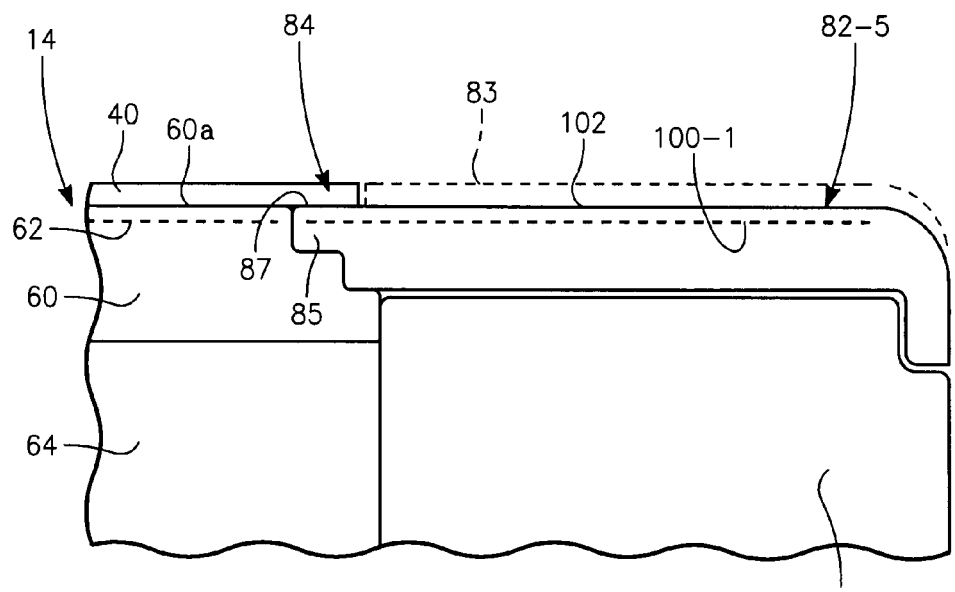
FIG. 6 depicts a fifth embodiment of a process ring for the reactor of FIG. 1.

FIG. 6 depicts a process ring 82-5 identical to that of FIG. 3 except that it further includes a floating outer electrode 100-1 contained within the process ring 82-5. The outer electrode 100-1 is coplanar with the electrode 62 of the electrostatic chuck 14. RF power applied to the electrostatic chuck electrode 62 is capacitively coupled to the outer electrode 100-1, so that the outer electrode 100-1 behaves as if it were a directly connected extension of the electrostatic chuck electrode 62. This feature better matches the RF electrical conditions at the process ring 82-5 to the conditions within the wafer diameter. As a result, non-uniformities attributable to the presence of the edge of the electrode 62 are essentially pushed far beyond the wafer edge, to the outer edge of the outer electrode 100-1. As a result, the support pedestal 14 has more uniform RF behavior from the center to the peripheral edge of the wafer 40. The ring 82-5 may have a top surface 83 (dashed line) that is coplanar with the top surface of the wafer 40 (as in FIG. 3). Alternatively, the ring 82-5 may have a top surface 102 (solid line) that is coplanar with the wafer support surfaces 87 and 60a.

Figure 7:
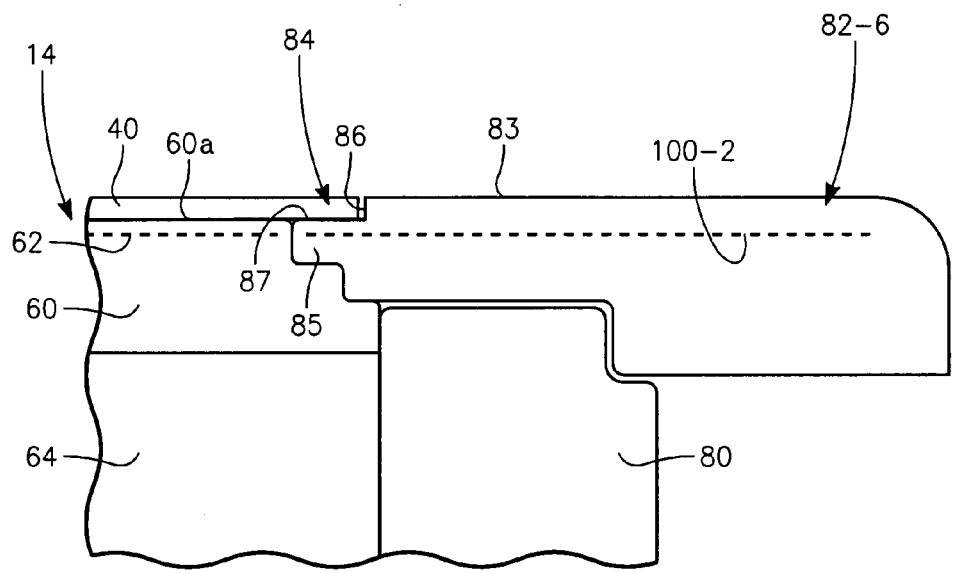
FIG. 7 depicts a sixth embodiment of a process ring for the reactor of FIG. 1.

FIG. 7 depicts a process ring 82-6 identical to that of FIG. 2 except that it contains within it an outer floating electrode 100-2 co-planar with the electrostatic chuck electrode 62. As in FIG. 6, the outer electrode 100-2 acts as a direct extension of the chuck electrode 62, so as to push far beyond the wafer edge the effects of the presence of an electrode outer edge.

Figure 8:
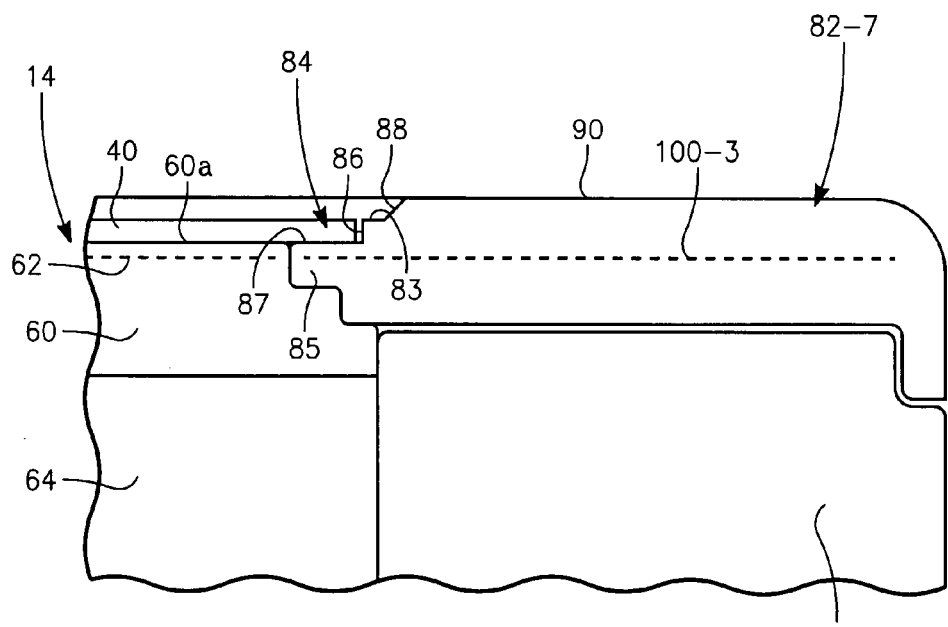
FIG. 8 depicts a seventh embodiment of a process ring for the reactor of FIG. 1.

FIG. 8 depicts a process ring 82-7 identical to that of FIG. 4 except that it contains within it an outer floating electrode 100-3 co-planar with the electrostatic chuck electrode 62. As in FIG. 6, the outer electrode 100-3 acts as a direct extension of the chuck electrode 62, so as to push far beyond the wafer edge the effects of the presence of an electrode outer edge.

Figure 9:
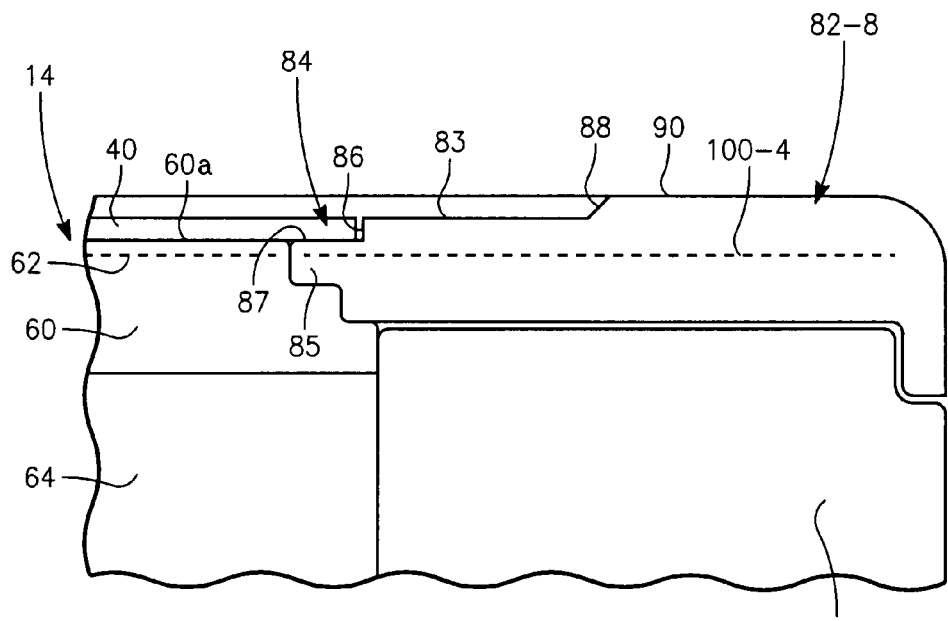
FIG. 9 depicts an eighth embodiment of a process ring for the reactor of FIG. 1.

FIG. 9 depicts a process ring 82-8 identical to that of FIG. 2 except that it contains within it an outer floating electrode 100-4 co-planar with the electrostatic chuck electrode 62. As in FIG. 6, the outer electrode 100-4 acts as a direct extension of the chuck electrode 62, so as to push far beyond the wafer edge the effects of the presence of an electrode outer edge.

While the embodiments of FIGS. 6-9 have been described with respect to a feature in which an outer floating electrode within the process ring 82 is co-planar with the electrostatic chuck electrode 62, in alternative embodiments the outer electrode 100 may not be co-planar but may be slightly below the electrostatic chuck electrode 62.

Figure 10:
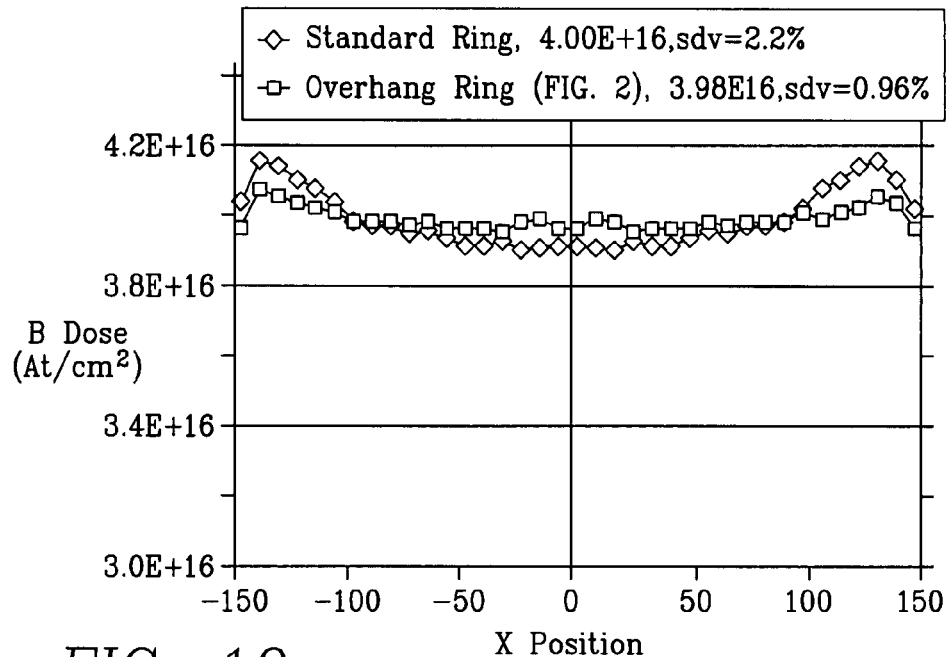
FIG. 10 is a graph of data comparing dopant concentration distributions obtained using one process ring and the process ring of FIG. 2.

FIG. 10 is a graph depicting implanted boron dose concentration in atoms per square cm (vertical axis) as a function of radial position on the wafer surface (horizontal axis). The curve constituting diamond-shaped symbols corresponds to a distribution obtained with a process ring having no overhang beyond the wafer support pedestal 14 and no raised top surface. The curve constituting square-shaped symbols corresponds to a distribution obtained with the process ring 82-1 of FIG. 2. FIG. 10 shows the improvement obtained with the embodiment of FIG. 2 in that the spike in dopant concentration at the wafer edge obtained with the non-overhanging process ring is reduced or eliminated in the distribution obtained with the process ring 82-1 of FIG. 2.

Figure 11:
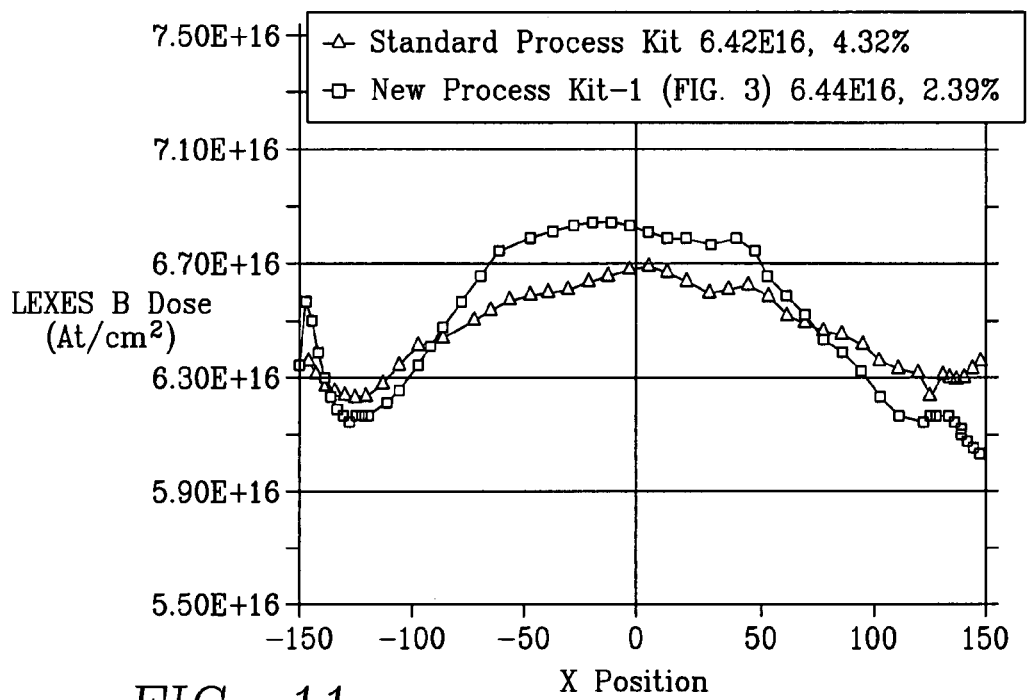
FIG. 11 is a graph of data comparing dopant concentration distributions obtained using one process ring and the process ring of FIG. 3.

FIG. 11 is a graph depicting implanted boron dose concentration in atoms per square cm (vertical axis) as a function of radial position on the wafer surface (horizontal axis). The curve constituting square-shaped symbols corresponds to a distribution obtained with a process ring having no overhang beyond the wafer support pedestal 14 and no raised top surface. The curve constituting diamond-shaped symbols corresponds to a distribution obtained with the process ring 82-2 of FIG. 3. FIG. 11 shows the improvement obtained with the embodiment of FIG. 2 in that the spike in dopant concentration at the wafer edge and the peak at the wafer center obtained with the non-overhanging process ring is reduced or eliminated in the distribution obtained with the process ring 82-2 of FIG. 3.

While the foregoing is directed to embodiments of the invention, other and further embodiments of the invention may be devised without departing from the basic scope thereof, and the scope thereof is determined by the claims that follow.

What is claimed is:

1. A plasma ion immersion plasma reactor, comprising:
a reactor chamber with a ceiling gas distribution plate and a wafer support pedestal with a wafer support surface facing said ceiling gas distribution plate, and an insulated electrode underlying said wafer support surface, said wafer support surface and said ceiling gas distribution plate defining a process zone between them;
a pair of mutually transverse reentrant conduits external of said chamber, each of said conduits being coupled to said chamber at ports on opposing sides of said process zone, and respective RF plasma source power applicators for coupling RF power into the interiors of respective ones of said reentrant conduits;
a dielectric ring surrounding said wafer support surface and having a first dielectric annular ring top surface that is co-planar with or above said wafer support surface, substantially the entirety of said first dielectric annular ring top surface being uncovered, said first dielectric annular ring top surface having an inner diameter that is separated from a circumferential periphery of said wafer support surface by a gap not exceeding about 1% of the diameter of said wafer support surface, said first dielectric annular ring top surface extending beyond a peripheral circumference of said wafer support surface by about 10%-20% of the diameter of said wafer support surface; and
a floating annular electrode inside said ring at a level below said first dielectric annular ring top surface and having an inner circular edge separated by an electrode-to-electrode gap from an outer circular edge of said insulated electrode of said wafer support pedestal.

2. The reactor of claim 1 wherein a radially inner portion of said dielectric ring underlies a peripheral annular portion of a wafer whenever a wafer is placed on said wafer support surface.

3. The reactor of claim 1 further comprising a raised second dielectric annular ring top surface surrounding and contiguous with said first dielectric annular ring top surface, said second dielectric annular ring top surface being displaced above said first dielectric annular ring top surface by a height at least as great as a thickness of a wafer to be held on said wafer support surface.

4. The reactor of claim 3 wherein said height is 1 mm -2 mm.

5. The reactor of claim 3 wherein said height exceeds said thickness of a wafer.

6. The reactor of claim 5 wherein said height is approximately twice said thickness of a wafer.

7. The reactor of claim 1 wherein said wafer support pedestal further comprises a puck layer forming said wafer support surface and formed of an insulating or semi-insulating material, said insulated electrode being enclosed within said puck layer, said reactor further comprising an RF bias power generator coupled to said insulated electrode, said electrode-to-electrode gap being a sufficiently small to enable said floating electrode and said insulated electrode to behave as a single electrode at the frequency of said RF bias power generator.

8. A plasma ion immersion plasma reactor, comprising:
a reactor chamber with a ceiling gas distribution plate and a wafer support pedestal with a wafer support surface and an insulated electrode underlying said wafer support surface, said wafer support surface and said ceiling gas distribution plate defining a process zone between them;
a pair of mutually transverse reentrant conduits external of said chamber, each of said conduits being coupled to said chamber at ports on opposing sides of said process zone, and respective RF plasma source power applicators for coupling RF power into the interiors of respective ones of said reentrant conduits;
a dielectric ring surrounding said wafer support surface and comprising:
(a) a first annular dielectric ring top surface that is coplanar with or above said wafer support surface, substantially the entirety of said first annular dielectric ring top surface being uncovered, said first annular dielectric ring top surface having an inner diameter that is separated from a circumferential periphery of said wafer support surface by a gap not exceeding about 1% of the diameter of said wafer support surface,
(b) a second annular dielectric ring top surface surrounding said first annular dielectric ring top surface, said second annular dielectric ring top surface being displaced above said first annular dielectric ring top surface by a height at least as great as a thickness of a wafer to be held on said wafer support surface,
(c) a floating annular electrode inside said dielectric ring at a level below said first dielectric annular ring top surface and having an inner circular edge separated by an electrode-to-electrode gap from an outer circular edge of said insulated electrode of said wafer support pedestal.

9. The reactor of claim 8 wherein a radially inner portion of said dielectric ring underlies a peripheral annular portion of a wafer whenever a wafer is placed on said wafer support surface.

10. The reactor of claim 9 wherein said height is approximately twice said thickness of a wafer.

11. The reactor of claim 8 wherein said height is 1 mm -2 mm.

12. The reactor of claim 8 wherein said height exceeds said thickness of a wafer.

13. The reactor of claim 8 wherein said wafer support pedestal further comprises a puck layer forming said wafer support surface and formed of an insulating or semi-insulating material, said insulated electrode being enclosed within said puck layer, said reactor further comprising an RF bias power generator coupled to said insulated electrode, said electrode-to-electrode gap being a sufficiently small to enable said floating electrode and said insulated electrode to behave as a single electrode at the frequency of said RF bias power generator.

14. A plasma ion immersion plasma reactor, comprising:
a reactor chamber with a ceiling gas distribution plate and a wafer support pedestal with a wafer support surface facing said ceiling gas distribution plate, and an insulated electrode underlying said wafer support surface, said wafer support surface and said ceiling gas distribution plate defining a process zone between them;

a pair of mutually transverse reentrant conduits external of said chamber, each of said conduits being coupled to said chamber at ports on opposing sides of said process zone, and respective RF plasma source power applicators for coupling RF power into the interiors of respective ones of said reentrant conduits;

a dielectric ring surrounding said wafer support surface and comprising:
  (a) a first annular dielectric ring top surface,
  (b) a floating annular electrode inside said dielectric ring at a level below said first annular dielectric ring top surface and having an inner circular edge separated by and electrode-to-electrode gap from an outer circular edge of said insulated electrode of said wafer support pedestal.

15. The reactor of claim 14 wherein said wafer support pedestal further comprises a puck layer forming said wafer support surface and formed of an insulating or semi-insulating material, said insulated electrode being enclosed within said puck layer, said reactor further comprising an RF bias power generator coupled to said insulated electrode, said electrode-to-electrode gap being a sufficiently small to enable said floating electrode and said insulated electrode to behave as a single electrode at the frequency of said RF bias power generator.

16. The reactor of claim 15 wherein said first annular dielectric ring top surface is co-planar with or above said wafer support surface.

17. The reactor of claim 14 wherein said dielectric ring comprises a ceramic material.

18. The reactor of claim 14 wherein said insulated electrode and said floating electrode are mutually co-planar.

* * * * *